United States Patent [19]

Fischer et al.

[11] Patent Number: 4,956,685
[45] Date of Patent: Sep. 11, 1990

[54] THIN FILM SOLAR CELL HAVING A CONCAVE N-I-P STRUCTURE

[75] Inventors: Roland Fischer, Nidderau; Gerhard Grabe, Rossdorf; Ekkard Niemann, Maintal, all of Fed. Rep. of Germany

[73] Assignee: Licentia Patent-Verwaltungs GmbH, Frankfurt, Fed. Rep. of Germany

[21] Appl. No.: 481,650

[22] Filed: Feb. 13, 1990

Related U.S. Application Data

[63] Continuation of Ser. No. 245,998, Sep. 14, 1988, abandoned.

[30] Foreign Application Priority Data

Dec. 21, 1984 [DE] Fed. Rep. of Germany ... 8437522[U]
Dec. 21, 1984 [DE] Fed. Rep. of Germany ....... 3446807

[51] Int. Cl.$^5$ ............................................. H01L 27/14
[52] U.S. Cl. .......................................... 357/30; 357/2; 357/55; 357/59; 357/58; 136/256
[58] Field of Search ................. 357/30 K, 30 J, 30 R, 357/30 P, 30 L, 30 D, 58, 59 D, 59 E, 55, 2; 136/256

[56] References Cited

U.S. PATENT DOCUMENTS

| | | | |
|---|---|---|---|
| 4,482,779 | 11/1984 | Anderson | 357/30 X |
| 4,497,974 | 2/1985 | Deckman et al. | 357/30 L X |
| 4,514,582 | 4/1985 | Tiedje et al. | 357/2 X |
| 4,532,537 | 7/1985 | Kane | 357/30 D |
| 4,556,790 | 12/1985 | Glass et al. | 357/30 D X |

FOREIGN PATENT DOCUMENTS

| | | |
|---|---|---|
| 0106540 | 4/1984 | European Pat. Off. . |
| 0112646 | 7/1984 | European Pat. Off. . |
| 3318852 | 3/1984 | Fed. Rep. of Germany . |
| 3427833 | 2/1985 | Fed. Rep. of Germany .......... 357/2 |
| 8413346 | 3/1985 | France . |

OTHER PUBLICATIONS

Jorg Miller, "Ultrafast Multireflection and Transparent Thin Film Silicon Photodiodes", Institut fur Hochfrequenztechnik, Technische Universitat Braunschweig, Zie Voor Titel Boek, Jun. 1983, pp. 420–421.

H. W. Deckman, C. R. Wronski and H. Witzke, "Fabrication of Optically Enhanced Thin Film $\alpha$-SiH$_x$ Solar Cells", J. Vac. Sci. Technolg., vol. A1, Apr.-Jun. 1983, pp. 578–582.

Bae, "Schottky Effect and Photovoltaic Devices on the Texturized Surfaces," Proc. 13th Int. Photovoltaic Spec. Conf., IEEE, Jun. 5-8, 1978, pp. 1337-1341.

Primary Examiner—William Mintel
Attorney, Agent, or Firm—McGlew & Tuttle

[57] ABSTRACT

A thin film solar cell with an n-i-p structure has a roughened substrate surface, and, to achieve an improved fill factor, the substrate surface of the solar cell is a multiply concave surface and has no sharp points.

6 Claims, 2 Drawing Sheets

THIN FILM SOLAR CELL HAVING A CONCAVE N-I-P STRUCTURE

This is a file wrapper continuation application of application Ser. No. 245,998 filed Sept. 14, 1988, now abandoned.

FIELD AND BACKGROUND OF THE INVENTION

This invention relates in general to solar cells and in particular to a new and useful thin film solar cell having a n-i-p structure which comprises a substrate having a roughened substrate surface with an n-layer for light entering the cell and wherein the surface is a multiply concave surface with no sharp points.

Solar cells are to convert the greatest possible part of the irradiated light energy into electrical energy. In solar cells such as thin film solar cells of a-Si the light of the long wave spectral range is not absorbed completely. A part of the light not absorbed is reflected by a metallic backside contact and can be utilized again in the solar cell. To obtain the longest possible optical path for this reflected light in the active solar cell layer it is known to reflect the light not perpendicularly, but at a flat angle; this is achievable by using a suitably structured backside electrode ("light trapping"). The short-circuit current of the solar cell is increased in this manner (Journal I. Vac. Sci. Technol., Al(2), 1983, pages 578, 582).

The charge carrier drift plays a big role in a-Si solar cells (n-i-p cells). Therefore, the electric field curve in the solar cell is important. The electric field should be as uniform as possible inside the solar cell and should nowhere assume the value zero, otherwise the recombination of the charge carriers would be increased or the capture length reduced, and the fill factor would drop (Appl. Phys. Lett. 44 (5), 1984, pages 437–539).

SUMMARY OF THE INVENTION

The invention provides a thin film solar cell in which the recombination of the charge carriers is reduced and the fill factor is thus increased.

Accordingly it is an object of the invention to provide a thin film solar cell with a n-i-p structure which comprises a substrate which a roughened substrate surface with an n-layer for light entering the cell and wherein the surface is a muiltiply concave surface with no sharp points.

Accordingly an object of the invention is to provide an improved solar cell construction with a surface having concave portions extending thereacross.

A further object of the invention is to provide a method of producing a solar cell wherein a substrate is first lapped with aluminum trioxide ($Al_2O_3$) powder and water and the grain size of the powder is approximately 3 microns and thereafter the substrate material is abraded to a roughness of approximately 0.5 to 3 microns and thereafter etched with a hydrofluoric acid.

A further object of the invention is to provide a solar cell which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

Figure 1:
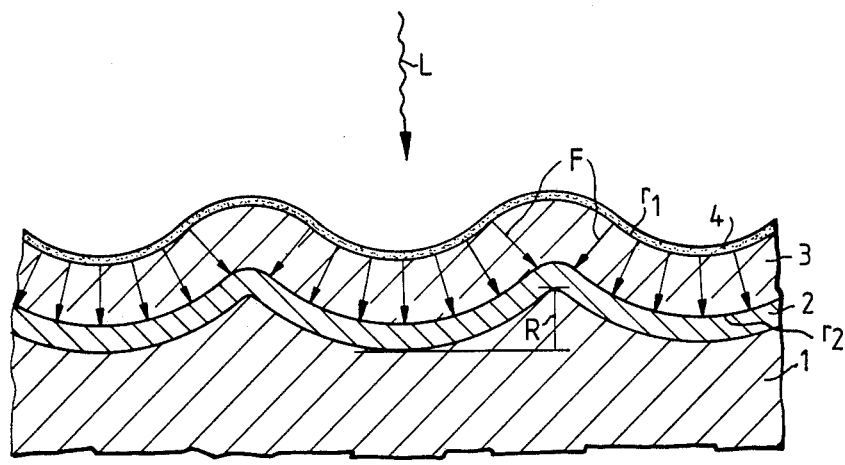
FIG. 1 is a transverse sectional view of a thin film solar cell having a substrate surface of multiply concave design in accordance with the invention.

Referring to the drawings in particular, the invention embodied therein comprises a thin film solar cell with an n-i-p structure and which includes a substrate 1 having a roughened substrate surface with an n-layer for light entering the cell. The surface 1 is a multiply concave surface with no sharp points.

Figure 2:
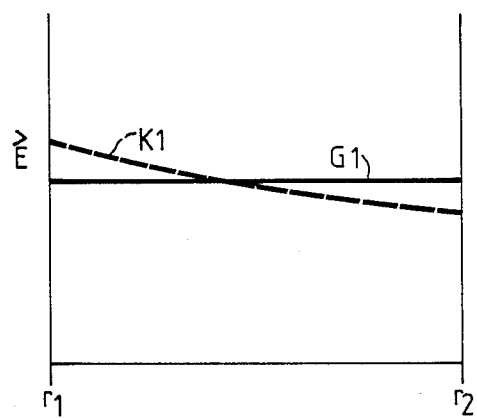
FIG. 2 is a diagram of the electric field strength in a plate capacitor and a spherical capacitor with the radii $r_1$ and $r_2$ with $r_1$ less than $r_2$, as may be seen from FIG. 1; the field of a plate capacitor being characterized by the unbroken curve G1 and that of a spherical capacitor by the broken curve K1.
Figure 3:
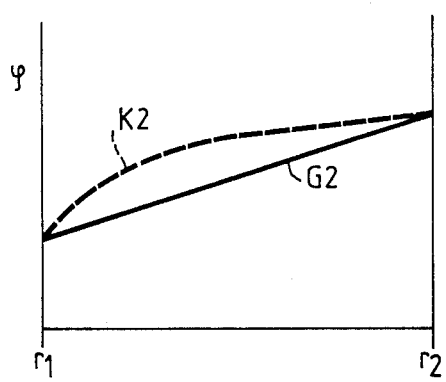
FIG. 3 is a potential curve diagram in a solar cell structure with a smooth and with a multiply concave roughened substrate.

In FIG. 1 may be seen a cutout of a roughened, multiply concave structure of an a-Si solar cell comprising a substrate 1, a metal film 2, an n-i-p-a-Si (semiconductor structure made from amorphous silicon with three superimposed layers including a layer of N conductivity type, a layer of P conductivity type and a layer of intrinsic type between said two layers, the semiconductor structure being positioned on the substrate with the layer of P conductivity type being positioned closest to the substrate) diode 3, an antireflection film 4 and an electric field F. The light penetrates the anti-reflection film for another n-doped film of the n-i-p solar cell (not shown), and enters the active i-a-Si film of the solar cell at $r_1$. R marks the surface roughness. The structure can be imaged as being constructed of spherical surfaces with the radii $r_1$ and $r_2$. The areas at the rim of each concave surface are neglected because they contribute little to the total surface. The intensity of the electric field increases in the concave areas near $r_1$ and decrease near $r_2$, as indicated by the curve K1 in FIG. 2. A statistically roughened substrate corresponds here in the mean to a smooth substrate, indicated by the curve G1. For a substrate surface designed multiply concave this leads to a substantially straight line G2 curve and to a more favorable potential curve K2 in the solar cell, as may be seen from FIG. 3. The curve G2 shows the potential response for a smooth substrate.

Figure 4:
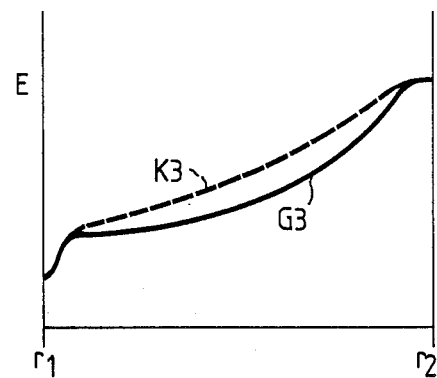
FIG. 4 is an energy band curve diagram in a solar cell with a smooth and with a multiply concave roughened substrate.

FIG. 4 shows the improved energy band curve K3 of a solar cell diode 3 with multiply concave substrate surface versus the energy band curve G3 of a solar cell with smooth substrate surface. As the shape of curve K3 demonstrates, the recombination of the charge carriers is reduced by the stronger electric field at the solar cell side ($r_1$) facing the light where the great majority of the light is absorbed. Also, the field in the i-a-Si layer of the solar cell is distributed more evenly between the doped areas at $r_1$, $r_2$ of the diode 3. This also reduces the recombination of the charge carriers. The reduction of the charge carrier recombination leads to a higher fill factor of the solar cell characteristic and besides the improvement of the short circuit current in roughened substrates, to a greater efficiency of the solar cell.

Figure 5:
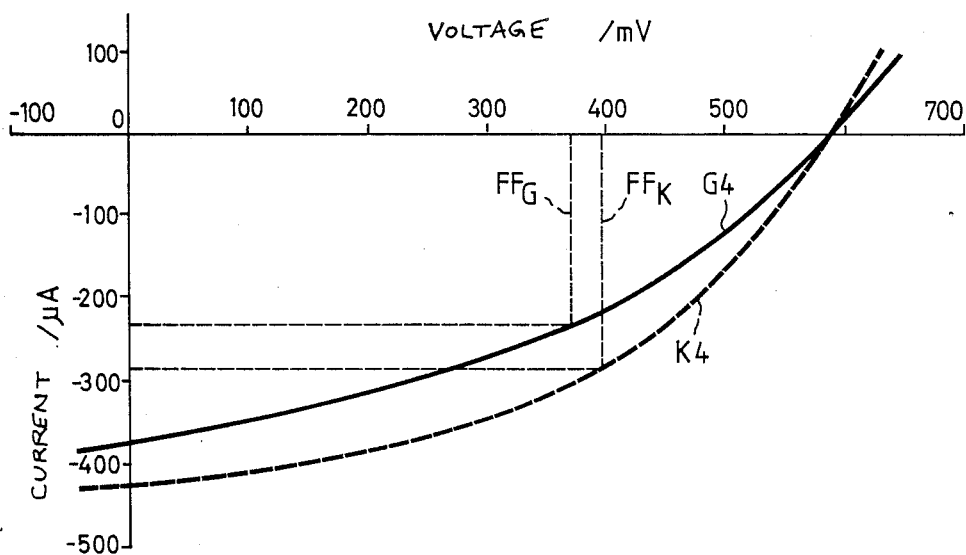
FIG. 5 is a characteristic curve diagram of a-Si solar cells under AM1 lighting with smooth and with multiply concave roughened substrate.

FIG. 5 shows the improvement of the solar cell characteristic of two a-Si solar cells under AM1 lighting of the type Al-ITO-n-aSi - i-asi - p-aSi - Ti - glass, the characteristic G4 relates to a smooth surface and the characteristic K4 relates to a multiply concave roughened substrate surface. The fill factors $FF_G$ and $FF_K$ of the solar cells in this example are 0.39 for the cell with smooth, and 0.46 for the cell with concave roughened substrate surface. The improvement of the fill factor brought about by the multiply concave roughened substrate surface amounts to about 18%.

In the following, an example of the production of a solar cell with a multiply concave roughened substrate surface is discussed.

The substrate material, quartz or glass, is lapped with $Al_2O_3$ powder and water. The grain size of the $Al_2O_3$ powder is about 3 $\mu$m. The material abrasion must be such that a surface roughness R of approximately 0.5 to 3 $\mu$m is obtained uniformly over the entire substrate. The substrate is subsequently cleaned in boiling trichlorethylene to dissolve the layer of wax used to fasten the substrate for lapping. Thereafter, the substrate is cleaned twice in boiling acetone. After additional cleaning steps the substrate is etched for about two seconds in hydrofluoric acid in an ultrasonic bath. It is then rinsed in warm water, for at least one minute; and for at least one minute in distilled water in the ultrasonic bath. Subsequently, the substrate is dried. The sharp points on the substrate are rounded off by the etching operation in hydrofluoric acid. This avoids short-circuits in the solar cell.

While a specific embodiment of the invention has been shown and described in detail to illustrate the application of the principles of the invention, it will be understood that the invention may be embodied otherwise without departing from such principles.

What is claimed is:

1. A thin film solar cell comprising: a substrate having a surface with a plurality of contiguous concave portions with rounded junctions therebetween; a semiconductor structure made from amorphous silicon with three superimposed layers including a layer of N conductivity type, a layer of P conductivity type and a layer of intrinsic type positioned between said layer of N conductivity type and said layer of P conductivity type, said semiconductor structure being positioned on said substrate with said layer of P conductivity type being positioned facing said substrate, a surface of said semiconductor structure having a plurality of contiguous concave portions with rounded junctions therebetween corresponding to said contiguous concave portions with rounded junctions therebetween of said substrate.

2. A thin film solar cell according to claim 1, wherein a metal layer is positioned between said layer of said P conductivity type and said substrate and an antireflective layer is disposed on said layer of N conductivity type.

3. A thin film solar cell according to claim 1, further comprising: a metal layer disposed between said layer of P conductivity type and said substrate.

4. A thin film solar cell according to claim 1, further comprising: an antireflective layer positioned upon said N conductivity type layer.

5. A thin film solar cell comprising: a substrate; a semiconductor structure made from amorphous silicon, including three superimposed layers with a layer of N-conductivity type, a layer of intrinsic type and a layer of P-conductivity type, said semiconductor structure being arranged on said substrate with said layer of P conductivity type being positioned on said substrate, said layer of intrinsic type being positioned on said layer of P conductivity type and said layer of N conductivity type; means for increasing the solar cell filling factor and for increasing the solar cell electric field intensity over portions of the solar cell including a plurality of contiguous concave portions formed on the surface of said substrate and each of said semiconductor layers and a plurality of rounded junction portions formed on said surface of said substrate and each of said semiconductor layers, said rounded junction portions being provided between each of said contiguous concave portions, each concave portion of a layer being defined by a radius $r_2$ and each rounded portion of a layer each being defined by a radius $r_1$, said radius $r_1$ being smaller than said radius $r_2$ for reducing recombination of charge carriers.

6. A thin film solar cell formed by the steps of: providing a substrate having a surface with a plurality of contiguous concave portions with rounded junctions therebetween; lapping a substrate material with $Al_2O_3$ powder and water having a grain size of approximately 3 microns and abrading the surface for a roughness of approximately 0.5 to 3 microns, thereafter etching the surface with a hydrofluoric acid for approximately 2 seconds in an ultrasonic bath.

* * * * *